United States Patent
Kawasaki

(10) Patent No.: US 9,614,524 B1
(45) Date of Patent: Apr. 4, 2017

(54) AUTOMATIC IMPEDANCE TUNING WITH RF DUAL LEVEL PULSING

(71) Applicant: APPLIED MATERIALS, INC., Santa Clara, CA (US)

(72) Inventor: Katsumasa Kawasaki, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/007,818

(22) Filed: Jan. 27, 2016

Related U.S. Application Data

(60) Provisional application No. 62/260,528, filed on Nov. 28, 2015.

(51) Int. Cl.
| | |
|---|---|
| H01L 21/30 | (2006.01) |
| H03K 19/00 | (2006.01) |
| H01J 37/32 | (2006.01) |
| G01R 27/02 | (2006.01) |

(52) U.S. Cl.
CPC .... H03K 19/0005 (2013.01); H01J 37/32082 (2013.01); H01J 37/32917 (2013.01); G01R 27/02 (2013.01); H01J 2237/334 (2013.01)

(58) Field of Classification Search
CPC .............. G01R 27/02; H01J 37/32082; H01J 37/32917; H03K 19/0005
See application file for complete search history.

(56) References Cited

U.S. PATENT DOCUMENTS

| | | | |
|---|---|---|---|
| 6,472,822 B1 | 10/2002 | Chen et al. | |
| 6,566,272 B2 | 5/2003 | Paterson et al. | |
| 6,818,562 B2 * | 11/2004 | Todorow .............. | H01J 37/321 |
| | | | 118/723 E |
| 6,942,813 B2 | 9/2005 | Ying et al. | |
| 7,141,514 B2 | 11/2006 | Chua | |
| 7,214,628 B2 | 5/2007 | Chua | |
| 7,718,538 B2 | 5/2010 | Kim et al. | |
| 7,737,042 B2 | 6/2010 | Kim et al. | |
| 7,771,606 B2 | 8/2010 | Kim et al. | |

(Continued)

OTHER PUBLICATIONS

U.S. Appl. No. 15/068,999, filed Mar. 14, 2016, Leray et al.
U.S. Appl. No. 14/882,878, filed Oct. 14, 2015, Kawasaki et al.
U.S. Appl. No. 14/886,891, filed Oct. 19, 2015, Kawasaki et al.

*Primary Examiner* — Alexander H Taningco
*Assistant Examiner* — Kurtis R Bahr
(74) *Attorney, Agent, or Firm* — Moser Taboada; Alan Taboada

(57) ABSTRACT

Methods and systems for RF pulse reflection reduction are provided herein. In some embodiments, a method includes (a) providing a plurality of pulsed RF power waveforms from a plurality of RF generators to a process chamber during a first duty cycle, (b) measuring a first power level impedance $Z_1$ and a different second power level impedance $Z_2$ at different time periods during the first duty cycle, (c) adjusting the second power level impedance Z2 towards 50 ohm such that a standing wave ratio (SWR) of the second power level impedance Z2 decreases towards 50 ohm and a SWR of the first power level impedance Z1 increases from 50 ohm, and (e) repeating (d) until the SWR of the first power level impedance $Z_1$ is substantially equal to the SWR of the second power level impedance $Z_2$.

17 Claims, 10 Drawing Sheets

(56) References Cited

U.S. PATENT DOCUMENTS

| | | | |
|---|---|---|---|
| 7,967,944 B2 | 6/2011 | Shannon et al. | |
| 8,002,945 B2 | 8/2011 | Shannon et al. | |
| 8,018,164 B2 * | 9/2011 | Shannon | H01J 37/32082 |
| | | | 156/345.2 |
| 8,264,154 B2 | 9/2012 | Banner et al. | |
| 8,324,525 B2 | 12/2012 | Shannon et al. | |
| 8,337,661 B2 | 12/2012 | Shannon et al. | |
| 8,357,264 B2 | 1/2013 | Shannon et al. | |
| 8,404,598 B2 | 3/2013 | Liao et al. | |
| 8,658,541 B2 | 2/2014 | Lee et al. | |
| 8,962,488 B2 | 2/2015 | Liao et al. | |
| 8,974,684 B2 | 3/2015 | Banna et al. | |
| 9,053,908 B2 | 6/2015 | Sriraman et al. | |
| 9,318,304 B2 | 4/2016 | Leray et al. | |
| 2009/0297404 A1 * | 12/2009 | Shannon | H01J 37/32082 |
| | | | 422/108 |
| 2011/0031216 A1 * | 2/2011 | Liao | H01J 37/32082 |
| | | | 216/67 |
| 2012/0000888 A1 * | 1/2012 | Kawasaki | H01J 37/32082 |
| | | | 216/67 |
| 2014/0265852 A1 | 9/2014 | Valcore, Jr. | |
| 2014/0305589 A1 | 10/2014 | Valcore, Jr. | |
| 2015/0002018 A1 | 1/2015 | Lill et al. | |
| 2015/0048740 A1 | 2/2015 | Valcore, Jr. et al. | |
| 2015/0069912 A1 | 3/2015 | Valcore, Jr. et al. | |
| 2015/0072530 A1 * | 3/2015 | Kim | H01L 21/3065 |
| | | | 438/703 |
| 2015/0130354 A1 * | 5/2015 | Leray | H01J 37/32082 |
| | | | 315/111.21 |

* cited by examiner

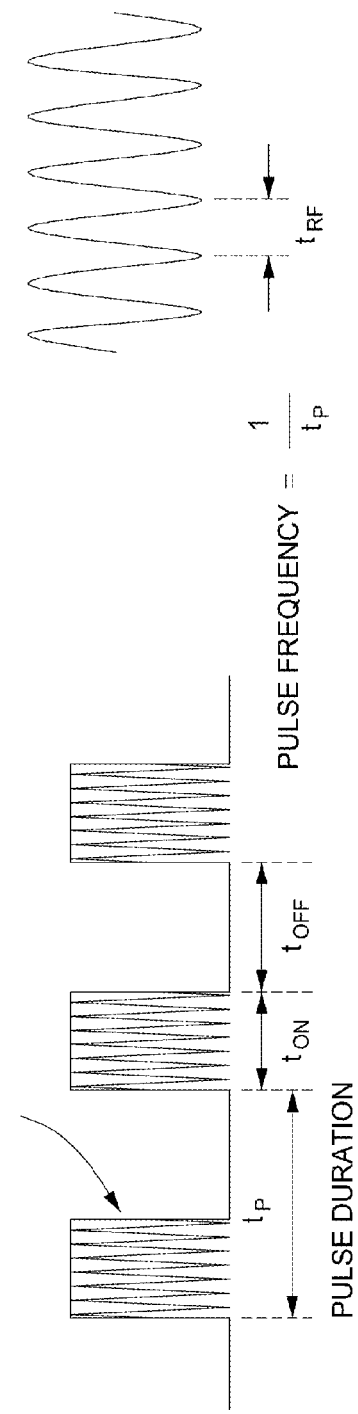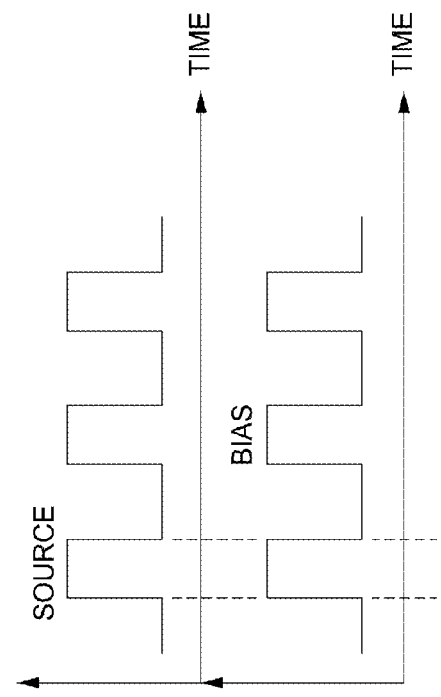
FIG. 2A
FIG. 2B
FIG. 2C

AUTOMATIC IMPEDANCE TUNING WITH RF DUAL LEVEL PULSING

CROSS-REFERENCE TO RELATED APPLICATIONS

This application claims benefit of U.S. provisional patent application Ser. No. 62/260,528, filed Nov. 28, 2015, which is herein incorporated by reference in its entirety.

FIELD

Embodiments of the present disclosure generally relate to RF power delivery methods used for processing a substrate.

BACKGROUND

In conventional radio frequency (RF) plasma processing, such as that used during stages of fabrication of many semiconductor devices, RF energy may be provided to a substrate process chamber via an RF energy source. The RF energy may be generated and provided in continuous or pulsed wave modes. Due to mismatches between the impedance of the RF energy source and the plasma formed in the process chamber, RF energy is reflected back to the RF energy source, resulting in inefficient use of the RF energy and wasting energy, potential damage to the process chamber or RF energy source, and potential inconsistency/non-repeatability issues with respect to substrate processing. As such, the RF energy is often coupled to the plasma in the process chamber through a fixed or tunable matching network that operates to minimize the reflected RF energy by more closely matching the impedance of the plasma to the impedance of the RF energy source. The matching network ensures that the output of the RF source is efficiently coupled to the plasma to maximize the amount of energy coupled to the plasma (e.g., referred to as tuning the RF power delivery). Thus, the matching network ensures that the total impedance (i.e., plasma impedance+chamber impedance+matching network impedance) is the same as the output impedance of the RF power delivery. In some embodiments, the RF energy source may also be capable of frequency tuning, or adjusting the frequency of the RF energy provided by the RF energy source, in order to assist in impedance matching.

In process chambers that use multiple separate RF power signals pulsed at multiple power levels, synchronized RF pulsing is typically used. The multiple separate RF power signals may be pulsed independently out-of-phase with each other, or with varying duty cycle. Synchronization may be accomplished through the use of transistor-transistor logic (TTL) signals. One master generator creates the TTL signal to the other slave generators for synchronization. Each RF generator (masters and slaves) can provide pulsed RF power at independent duty cycles and/or pulse delays.

However, in RF single level pulsing (SLP) or dual level pulsing (DLP) using multiple separate RF power signals pulsed at multiple power levels (e.g., each with high/low power settings), the multiple impedance changes that occur during a pulse duty cycle makes impedance tuning difficult. That is, the match network and/or RF generators cannot adequately tune for the reflected power as the reflected power changes multiple times within each duty cycle. More specifically, RF matching can typically only tune to one impedance and cannot tune both impedances to 50 ohm at the same time.

Accordingly, the inventors have provided improved methods and apparatus for RF pulse reflection reduction in process chambers that use multiple separate RF power signals, pulsed at multiple power levels.

SUMMARY

Methods and systems for RF pulse reflection reduction are provided herein. In some embodiments, a method includes (a) providing a plurality of pulsed RF power waveforms from a plurality of RF generators to a process chamber during a first duty cycle, (b) measuring a first power level impedance $Z_1$ and a different second power level impedance $Z_2$ at different time periods during the first duty cycle, (c) adjusting the second power level impedance $Z_2$ towards 50 ohm such that a standing wave ratio (SWR) of the second power level impedance $Z_2$ decreases towards 50 ohm and a SWR of the first power level impedance $Z_1$ increases from 50 ohm, and (e) repeating (d) until the SWR of the first power level impedance $Z_1$ is substantially equal to the SWR of the second power level impedance $Z_2$.

In some embodiments, a non-transitory computer readable medium having instructions stored thereon that, when executed, cause a method of operating a plasma enhanced substrate processing system using multi-level pulsed RF power to be performed. The method performed may include (a) providing a plurality of pulsed RF power waveforms from a plurality of RF generators to a process chamber during a first duty cycle, (b) measuring a first power level impedance $Z_1$ and a different second power level impedance $Z_2$ at different time periods during the first duty cycle, (c) adjusting the second power level impedance $Z_2$ towards 50 ohm such that a standing wave ratio (SWR) of the second power level impedance $Z_2$ decreases towards 50 ohm and a SWR of the first power level impedance $Z_1$ increases from 50 ohm, and (e) repeating (d) until the SWR of the first power level impedance $Z_1$ is substantially equal to the SWR of the second power level impedance $Z_2$.

In some embodiments, a substrate processing system may include a plurality of RF generators configured to provide a plurality of pulsed RF power waveforms to a process chamber during a first duty cycle, at least one voltage/current measuring device configured to measure reflected power for the plurality of pulsed RF power waveforms, and at least one match network coupled to the plurality of RF generators, wherein the at least one match network is configured to (a) adjust a first power level impedance Z1 to 50 ohm, (b) adjust the second power level impedance $Z_2$ towards 50 ohm such that a standing wave ratio (SWR) of the second power level impedance $Z_2$ decreases towards 50 ohm and a SWR of the first power level impedance $Z_1$ increases from 50 ohm, and (c) repeat (b) until the SWR of the first power level impedance Z1 is substantially equal to the SWR of the second power level impedance Z2.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 2A-C depicts pulsed waveforms of radio frequency signals in accordance with some embodiments of the present disclosure.

Figure 1:
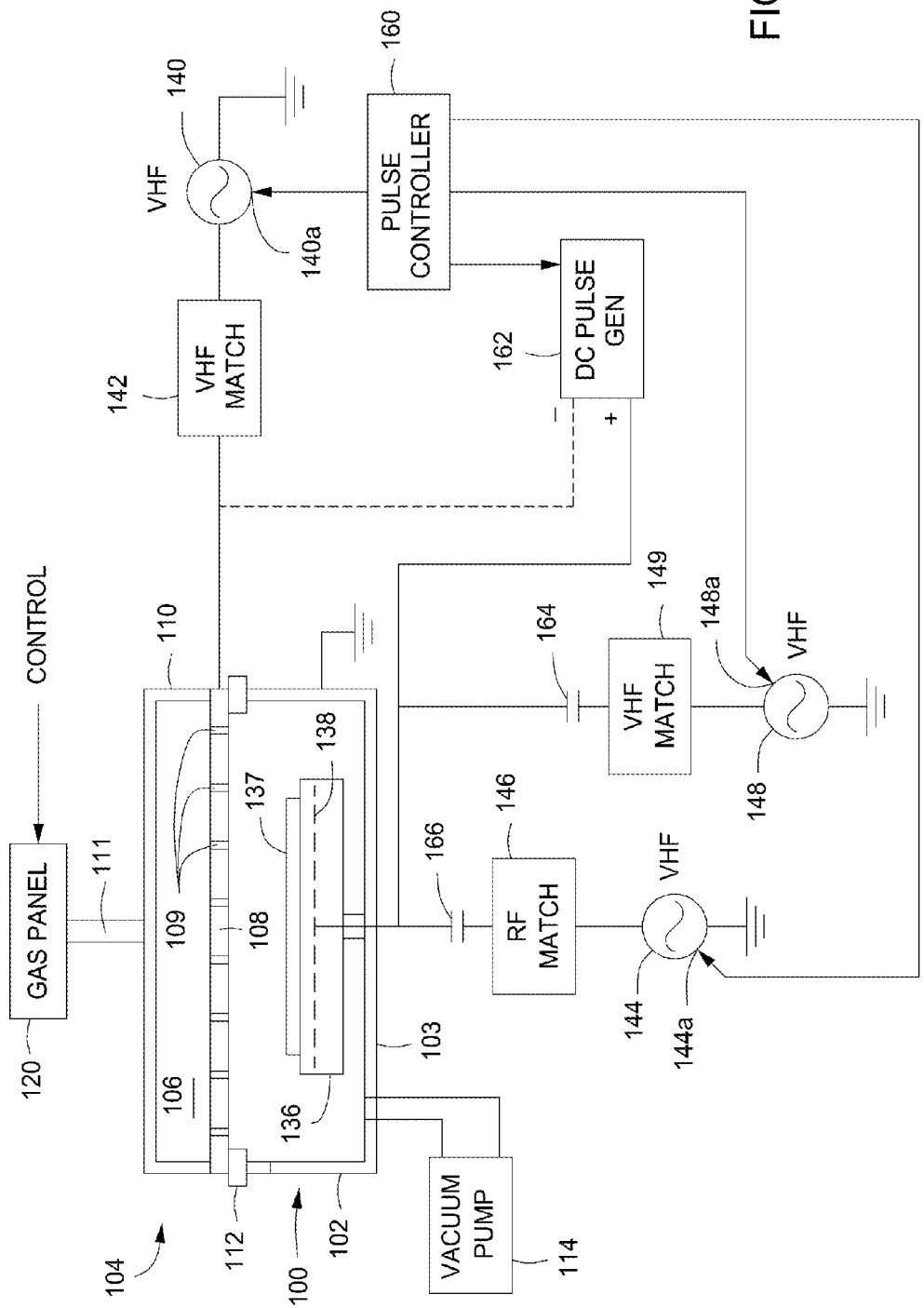
FIG. 1 depicts a plasma reactor in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide improved methods and apparatus for RF pulse reflection reduction in process chambers that use multiple separate RF power signals pulsed at multiple power levels. Specifically, improved methods and apparatus minimize reflected powers during pulsing of multiple separate RF power signals at multiple power levels, and averaging the standing wave ratios (SWRs) of the impedances measured to get repeatability and reliability for process chamber matching. In some embodiments, an RF matching network includes one or more RF voltage/current measuring devices (e.g., VI probe/sensor) to detect impedance and tune the impedance towards 50 ohm. In some embodiments, the RF voltage/current measuring devices can detect a plurality of impedances produced by multiple separate RF power signals at multiple power levels, along with a synchronized DC signal. Embodiments of the present disclosure advantageously provide consistent power regulation and improved productivity, and better chamber to chamber matching.

FIG. 1 depicts a plasma reactor which may be utilized to perform the inventive methods disclosed herein. The inventive methods may be performed in a capacitively coupled plasma reactor (e.g., as illustrated in FIG. 1) or any other suitable plasma reactor, such as an inductive coupled plasma reactor. However, the inventors have observed that the inventive methods can be particularly beneficial in capacitively coupled plasma reactors, such as where high bias power (e.g., about 2000 W or more) and low source power (e.g., about 500 W or less) is used, as undesired charging effects can be much more severe than, for example, in inductively coupled plasma processing chambers. In some embodiments, the inventors have discovered that the present inventive methods provide particular benefit in configurations where at least one of a DC bias ($V_{Dc}$), a $V_{RF}$, or a plasma sheath voltage are at or above about 1000V.

The reactor of FIG. 1 includes a reactor chamber 100 enclosed by a cylindrical side wall 102, a floor 103 and a ceiling 104. The ceiling 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., ceiling 104) is electrically insulated from the cylindrical side wall 102 by an insulating ring 112. A vacuum pump 114, such a turbomolecular pump, evacuates the chamber 100. A gas panel 120 controls the individual flow rates of different process gases to the gas supply inlet 111. A workpiece support pedestal 136 supported through the floor 103 of the chamber may have an insulating top surface and an internal electrode (wafer support electrode 138). The internal electrode may, for example, be used for chucking a substrate 137 on the top surface of the support pedestal 136. Plasma source power is applied to the ceiling 104 (also referred to herein as a gas distribution showerhead) from a generator 140 through an impedance matching network 142. The ceiling or gas distribution showerhead is formed of a conductive material, such as aluminum for example, and therefore serves as a ceiling electrode. The generator 140 may generate VHF power in the high portion of the VHF spectrum, such as in a range of 100 to 200 MHz. The generator 140 has the capability of pulsing the VHF power generated at a desired pulse rate and duty cycle. For this purpose, the VHF source generator 140 has a pulse control input 140a for receiving a control signal or signals defining the pulse rate and/or duty cycle as well as the phase of each pulse produced by the RF generator 140.

Plasma bias power is applied to the wafer support electrode 138 from an RF bias generator 144 through an RF impedance matching network 146, and RF bias generator 148 through an RF impedance matching network 149. The RF bias generators 144, 148 may generate HF or LF power in the low portion of the HF spectrum or in the MF or LF spectrum, such as in a range of 13.56 MHz or a on the order of 1-2 MHz. The RF bias generators 144, 148 have the capability of pulsing the RF bias power generated at a desired pulse rate and duty cycle. For this purpose, the RF bias generators 144, 148 have pulse control inputs 144a, 148a for receiving a control signal or signals defining the pulse rate and/or duty cycle as well as the phase of each pulse produced by the RF generators 144,148. The RF bias generators 144, 148 may be independently pulsed, phased, and/or duty cycle controlled. Further, the RF bias generators 144, 148 may be pulsed synchronously or asynchronously.

Optionally, plasma source power may be applied to the wafer support electrode 138 from a second VHF generator through a VHF impedance match (not shown). The second VHF generator may generate VHF power in the low portion of the VHF spectrum, such as in a range of 50 to 100 MHz. The second VHF generator has the capability of pulsing the VHF power generated at a desired pulse rate and duty cycle. For this purpose, the second VHF generator has a pulse control input for receiving a control signal or signals defining the pulse rate and/or duty cycle as well as the phase of each pulse produced by the second VHF generator. For example, in some embodiments, one of the RF bias generators 144, 148 and its components (e.g., match, pulse control inputs, etc.) can be replaced with the second VHF generator and its components. Alternatively, the second VHF generator and its components may be included in addition to the first RF generator 140, and the bias generators 144, 148 and their respective components.

In some embodiments, the matching networks 142, 146, and 149 may be formed by one or more capacitors and/or an inductor. The values of capacitor may be electronically or mechanically tuned to adjust the matching of each of the matching networks 142, 146, and 149. In lower power systems, the one or more capacitors may be electronically tuned rather than mechanically tuned. In some embodiments, the matching networks 142, 146, and 149 may have a tunable inductor. In some embodiments, one or more of the capacitors used in the matching networks 142, 146, and 149 may be one or more fixed capacitors or series capacitors. In other embodiments, one or more of the capacitors used in the matching networks 142, 146, and 149 may be a variable capacitor, which may be electronically or mechanically tuned to adjust the matching of the matching networks 142, 146, and 149. In some embodiments, one or more of the matching networks 142, 146, and 149 may have a capacitive shunt to ground. The above described matching networks are illustrative only and other various configurations of matching networks having one or more adjustable elements for tuning the matching network may be utilized and tuned in accordance with the teachings provided herein.

A pulse controller 160 is programmable to apply pulse control signals to each of the pulse control inputs 140a, 144a, 148a of the generators 140, 144, 148, to produce the desired phase lead or lag relationship and/or duty cycle relationship among the pulses of the generator 140 (e.g., VHF source power generator) and the RF bias power generators 144, 148. Although shown as a separate component in FIG. 1, in some embodiments, the pulse controller 160 can be disposed internally inside of each RF generator. Synchronization signals would be generated at a master generator (e.g., generator 140), and sent to other slave generators (e.g., generators 144 and/or 148).

In some embodiments, the RF generators 140, 144 and 148, the match networks 142, 146, and 149, and/or the pulse controller 160 comprise a central processing unit (CPU), a plurality of support circuits, and a memory. While the present exemplary embodiments of the RF generators 140, 144 and 148, the match networks 142, 146, and 149 and pulse controller 160 are discussed with respect to a computer having a CPU, support circuits, and a memory, one of ordinary skill in the art would recognize that RF generators 140, 144 and 148, the match networks 142, 146, and 149, and pulse controller 160 could be implemented in a variety of ways, including as an application specific interface circuit (ASIC), a field-programmable gate array (FPGA), a system-on-a-chip (SOC), and the like. Various embodiments of the pulse controller 160 may also be integrated within other process tool controllers, with corresponding input/output interfaces as known in the art.

The support circuits may include a display device as well as other circuits to support the functionality of the CPU. Such circuits may include clock circuits, cache, power supplies, network cards, video circuits and the like The memory may comprise read only memory, random access memory, removable memory, disk drives, optical drives and/or other forms of digital storage. The memory is configured to store an operating system, and a sub-fab control module. The operating system executes to control the general operation of the RF generators 140, 144 and 148, the match networks 142, 146, and 149, and pulse controller 160, including facilitating the execution of various processes, applications, and modules to control the one or more generators 140, 144 and 148 or the match networks 142, 146, and 149 in order to perform the methods discussed here (e.g., method 600 discussed below).

Further, a DC generator 162 may be coupled to either (or both) the wafer support electrode 138 and the ceiling 104. In some embodiments, DC generator 162 may supply continuous and/or variable DC. In some embodiments, DC generator 162 may provide pulsed DC power. The pulse repetition rate, phase and duty cycle of the DC generator are controlled by the pulsed controller 160. A DC isolation capacitor 164, 166 may be provided to isolate each RF generator from the DC generator 162. A DC signal generated by the DC generator may be synchronized with the RF signals generated by the generators 140, 144, and 148 to provide benefits such as reduced charge-up on a substrate 137 or improved etch rate control of the substrate using a plasma formed in the plasma reactor.

FIG. 2A depicts a time domain waveform diagram that may reflect the pulsed RF output of each of the generators 140, 144, 148, showing the pulse envelope of the pulsed RF output, characterized by the following parameters controlled by the pulse controller 160 individually for each generator 140, 144, 148: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

FIGS. 2B and 2C depict contemporaneous time domain waveforms of two RF pulsed signals synchronized together in such a manner that they have identical phase and duty cycle and therefore a phase difference of zero between them. The exemplary embodiment depicted in FIGS. 2B and 2C is one exemplary form of synchronization between a first pulsed RF signal (e.g., a pulsed source signal) and a second pulsed RF signal (e.g., a pulsed bias signal). In this exemplary embodiment, both the phase and duty cycle of each pulsed signal is the same.

Figure 3B:
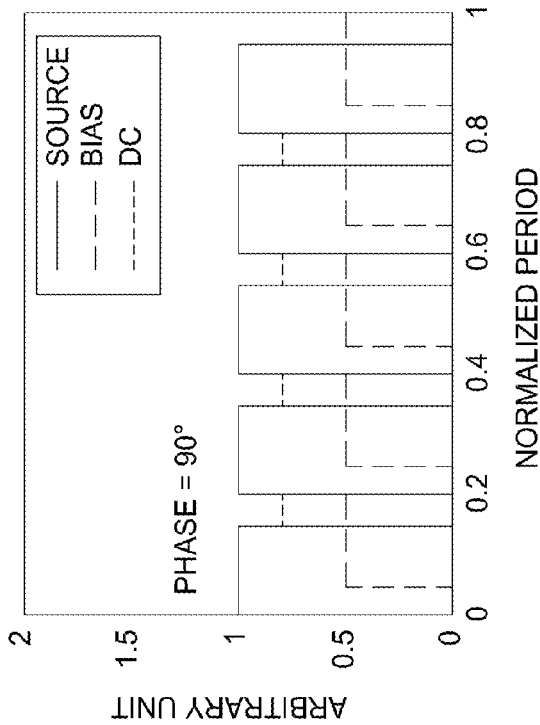
FIG. 3A-D depicts phase variance between pulsed waveforms in accordance with some embodiments of the present disclosure.
Figure 3A:
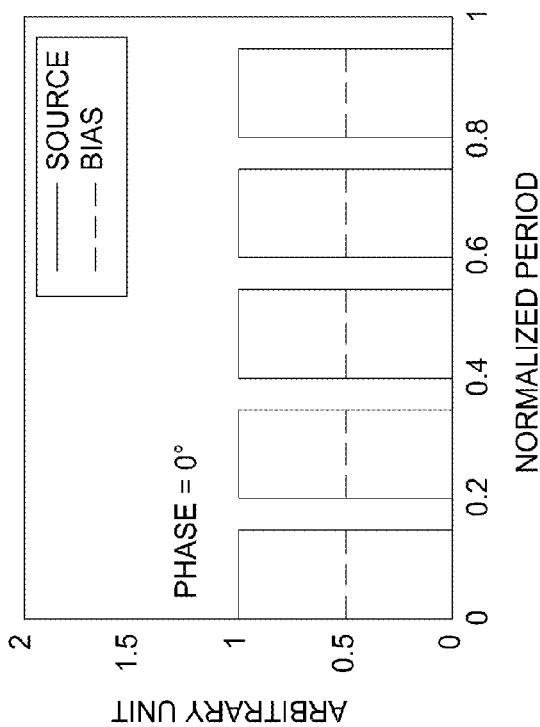
Figure 3C:
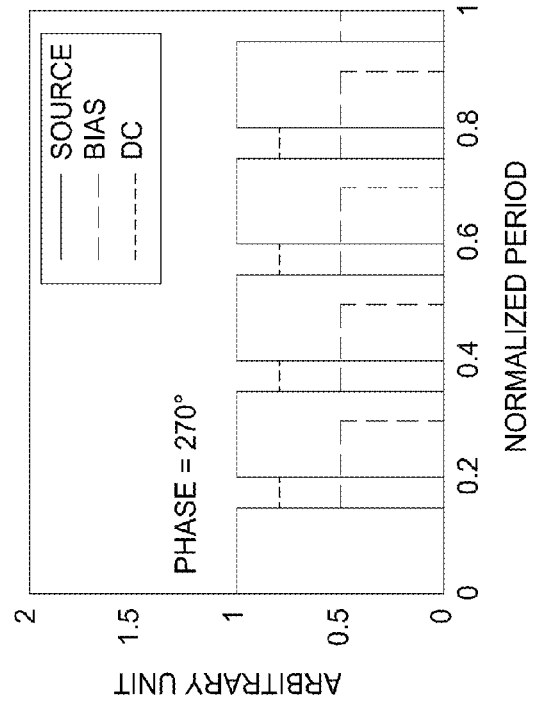
Figure 3D:
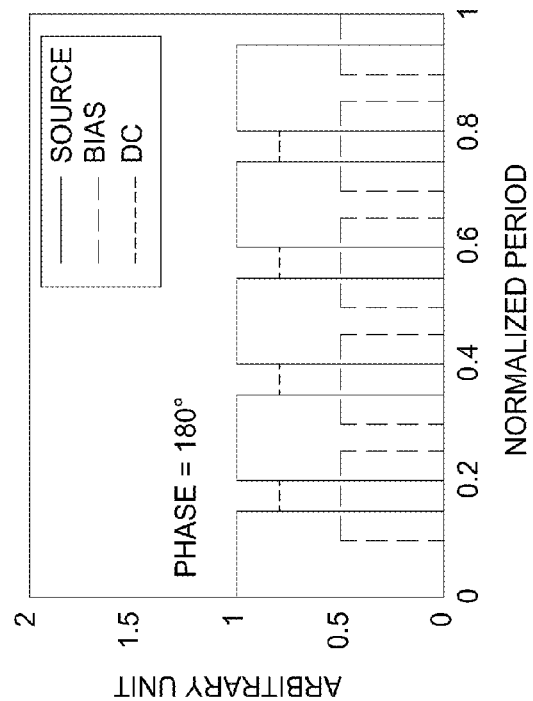

In some embodiments of the present disclosure, the pulsed signals provided by the generators 140, 144, and 148 are varied in phase. FIGS. 3A through 3D illustrate how the phase difference may be varied by the pulse controller 160, and depict the superposition of the source and bias power waveforms at phase differences of 0°, 90°, 180° and 270°, respectively, where the phase difference is defined by how much the second pulse output lags the first pulse output. FIG. 3A corresponds to the example of zero phase difference of FIG. 2B. FIG. 3B depicts a case in which the bias power pulse output lags the source power pulse output by 90°. FIG. 3C depicts a case in which the bias power pulse output lags the source power pulse output by 180 degrees. FIG. 3D depicts a case in which the bias power pulse output lags the source power pulse output by 270°. Although FIGS. 3A-3B only depict two pulsed RF signals with varying phase, in embodiments consistent with the present disclosure can also include three or more pulsed RF signals with varying phases.

In some embodiments, etching rates may be enhanced while pulsing the plasma by controlling the phase lead or lag of the RF envelopes. When the source and bias are pulsed independently out-of-phase, or with varying duty cycle, the different plasma dynamics of the very high frequency (VHF) and low frequency (LF) allow for better plasma fill over the entire pulse. In some embodiments, a combination of VHF of about 162 MHz source frequency is used in conjunction with a bias frequency of about 13.56 MHz and another bias frequency of about 2 MHz. In some embodiments, a combination of VHF of about 162 MHz source frequency is used in conjunction with a bias frequency of about 60 MHz and another bias frequency of about 2 MHz. In some embodiments, a source frequency of about 60 MHz is used in combination with bias frequencies of about 2 MHz and/or about 13.56 MHz.

Figure 4A:
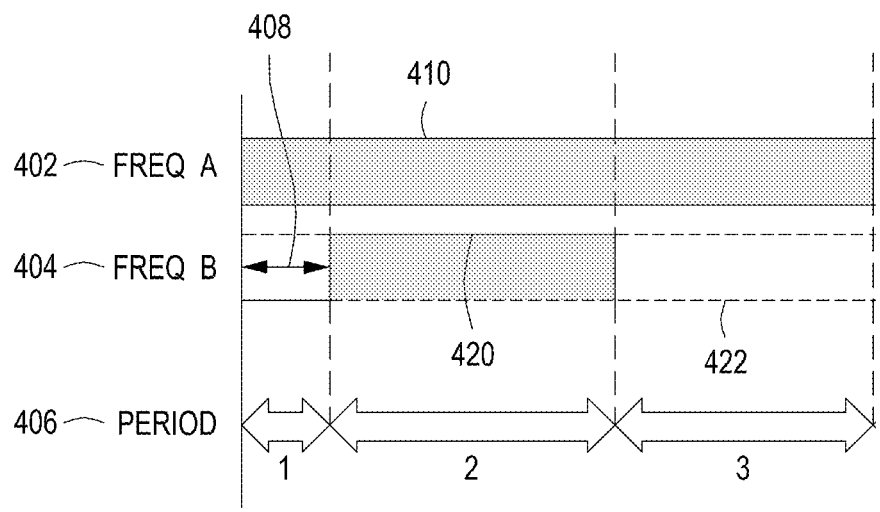
FIG. 4A depicts a Multi-Stroke Cycle Pulse (MSCP) using single level pulsing (SLP) designed for acquisition of multi-frequency RF mixing in accordance with some embodiments of the present disclosure.

FIG. 4A depicts multiple separate RF power signals that may be provided continuously or pulsed at multiple power levels in accordance with some embodiments of the present disclosure. More specifically, FIG. 4A depicts a Multi-Stroke Cycle Pulse (MSCP) using single level pulsing (SLP) for multi-frequency RF mixing. In FIG. 4A, two separate RF power waveforms are shown, a first continuous wave (CW) RF power waveform 402 and a second pulsed RF power waveform 404. In other embodiments, three or more separate RF power waveforms may be used in any combination of continuous wave (CW) or pulsed power waveforms. Each of the two separate RF power waveforms 402 and 404 may be provided at multiple power levels independently and out-of-phase with each other, or with varying duty cycle consistent with embodiments of the present disclosure. The RF power waveforms 402 and 404 may be provided by one or more of source and bias RF generators 140, 144, and 148. In embodiments where there are two or more pulsed RF power waveforms, the separate pulsed RF power waveforms may be pulsed synchronously with each other. In some embodiments, the separate RF power waveforms may be pulsed asynchronously.

In some embodiments, the frequency of the first RF power waveform may be about 2 Mhz to about 162 MHz. In some embodiments, the power level of the first CW RF power waveform may be about 200 watts to about 5.0 KW (e.g., 3.6 KW). If the first RF power waveform is pulsed, the value of the second power level may be about 0-100% of the first power level. In other embodiments, the second power level may be greater than the first power level.

In FIG. 4A, the first RF power waveform 402 may be introduced at time $t_0$ and may comprise a first power pulse 410 at a first power level. In some embodiments, the first RF waveform 402 may be provided at a frequency of about 2 MHz to about 162 MHz. In other embodiments, other frequencies as described above may be used.

The second RF power waveform 404 may also be introduced at time $t_0$ or after a delay period 408. The second RF power waveform 404 may comprise a first power pulse 420 at a first power level and a second power pulse 422 at a second power level. As illustrated in FIG. 4A, the first RF power pulse 420 may precede the second RF power pulse 422. If desired, additional RF power pulses may be provided in that order, or in a different order. As shown in FIG. 4A, the first RF power pulse 420 may be provided at a high power level, the second RF power pulse 422 may be provided at a zero power level, or a low power level that is lower than the first power level of the first RF power pulse 420. Additional steps (i.e., additional RF power pulses) and power levels may be used as appropriate. In some embodiments, the length of each of the time periods that each RF power pulse 420 and 422 is applied may be different from each other. In other embodiments, the length of each of the time periods that each RF power pulse 420 and 422 is applied may be equivalent to each other. In some embodiments, the second RF waveform 404 may be provided at a frequency of about 2 MHz to about 162 MHz. In other embodiments, other frequencies as described above may be used.

In some embodiments, the duty cycles of the separate RF power waveforms, are synchronized. In some embodiments, a separate synchronized TTL timing signal (not shown) may also be applied which also affects the impendences. In some embodiments, the synchronized timing signal may be a 13 MHz on/off timing signal. In some embodiments the synchronized timing signal may be a DC signal.

Figure 4B:
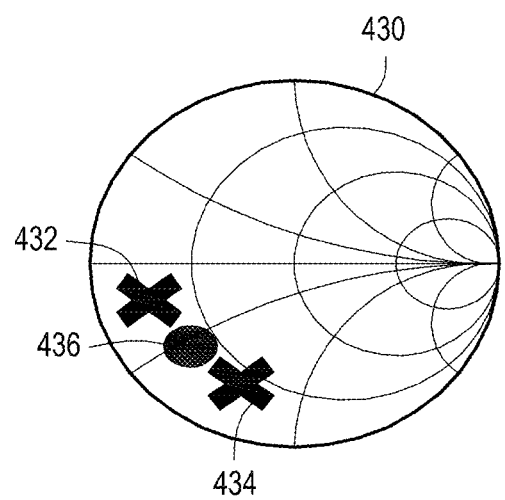
FIG. 4B depicts a Smith chart associated with the MSCP using single level pulsing (SLP) shown in FIG. 4A in accordance with some embodiments of the present disclosure.

FIG. 4A depicts three separate periods 406 with varying impendences and reflected power levels. In the Examiner shown in FIG. 4A, periods 1 and 3 would have equivalent impendences. FIG. 4B depicts a Smith chart 430 which depicts the impedances during periods 1 and 3 at 432 and the impendence during period 2 at 434. The Smith chart 430 also depicts the match tuning point 436 for the first frequency of the first RF power waveforms 402, for example, which tunes into middle point to produce the same level of reflected power during periods 1, 2 and 3. However, even when the frequencies are tuned, the reflected power might be too high because of the impedance gap caused by the 13 MHz on/off timing signal. The plasma impedances would be different between periods 1 and 3 and period 2 because power combinations of all RF powers are different. Plasma impedance is changed the power combination supplied.

Figure 5A:
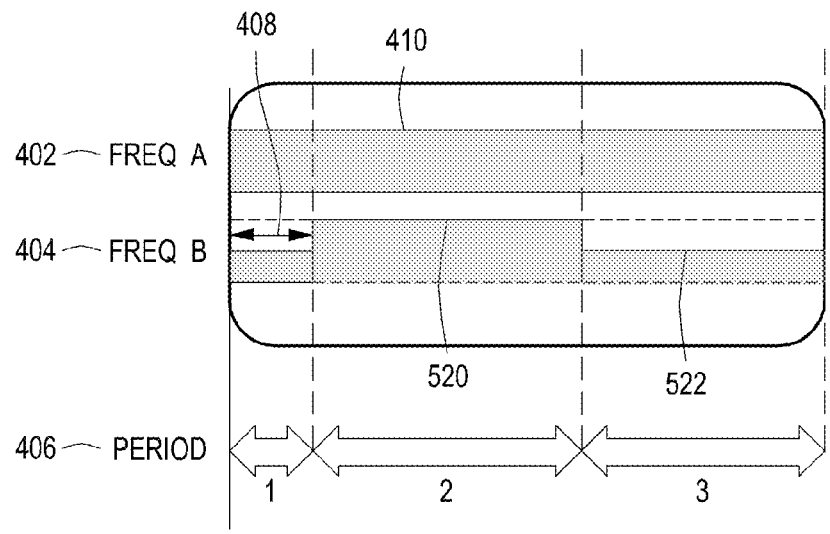
FIG. 5A depicts a Multi-Stroke Cycle Pulse (MSCP) using Dual level pulsing (DLP) designed for acquisition of multi-frequency RF mixing in accordance with some embodiments of the present disclosure.
Figure 5B:
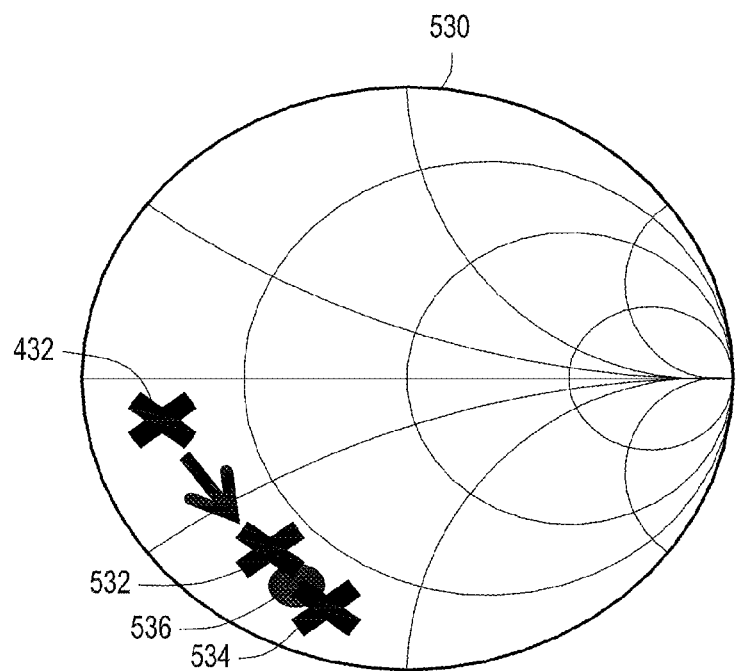
FIG. 5B depicts a Smith chart associated with the MSCP using dual level pulsing (DLP) shown in FIG. 5A in accordance with some embodiments of the present disclosure.

The aforementioned issues may be addressed by using dual level pulsing (DLP). For example, FIGS. 5A and 5B are similar to FIGS. 4A and 4B but depict a Multi-Stroke Cycle Pulse (MSCP) using dual level pulsing (DLP) designed for acquisition of multi-frequency RF mixing, instead of single level pulsing. In FIG. 5A, a power waveform 504 may comprise a first power pulse 520 at a first power level and a second power pulse 522 at a second non-zero power level. As shown in FIG. 5A, the first RF power pulse 520 may be provided at a high power level, the second RF power pulse 522 may be provided at a low power level that is lower than the first power level of the first RF power pulse 520.

In the Smith chart 530 shown in FIG. 5B, the impedance 532 of periods 1 and 3 is shown to be closer to impedance 534 of period 2 then the impedance 432 produced using CW. The Smith chart 530 also depicts the match tuning point 536 for the first frequency 502.

Figure 6:
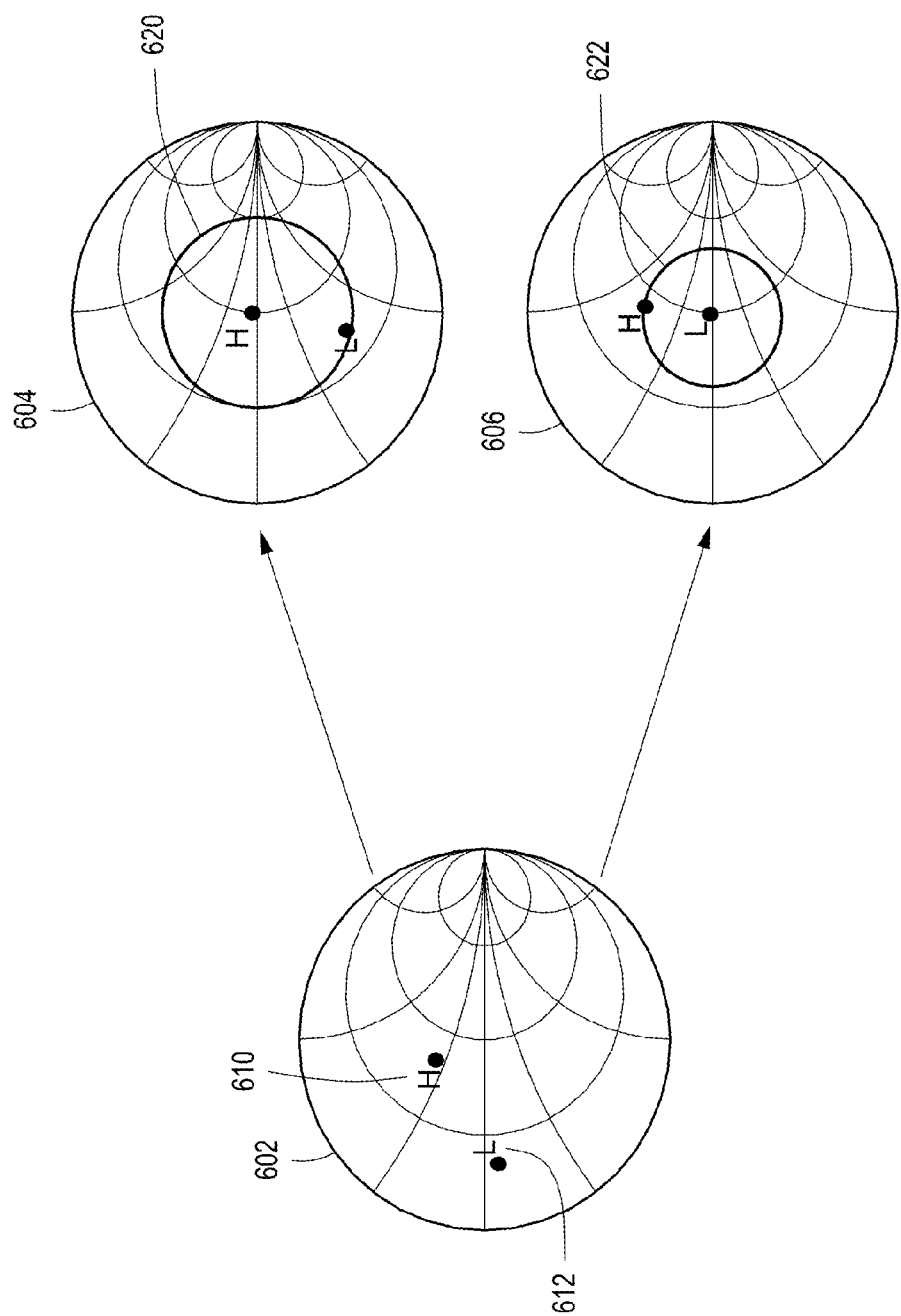
FIG. 6 depicts various Smith charts which show what happens when either a high level impedance or a low level impedance is tuned in accordance with some embodiments of the present disclosure.

FIG. 6 shows what happens when either the high level impedance 610 or the low level impedance 612 is tuned in Smith charts 602, 604, and 606. For example, as shown in chart 604, when the high level impedance is tuned to 50 ohm at the center of the standing wave ratio (SWR) circle 620, the low level impedance still has a high reflected power. The SWR is a measure of impedance matching of loads to the characteristic impedance of a transmission line or waveguide. Impedance mismatches result in standing waves along the transmission line, and SWR is defined as the ratio of the partial standing wave's amplitude at an antinode (maximum) to the amplitude at a node (minimum) along the line. Points on the SWR circle have the same reflected power level. Similarly, as shown in chart 606, when the low level impedance is tuned to 50 ohm at the center of the standing wave ratio (SWR) circle 622, the high level impedance still has a high reflected power.

Figure 7:
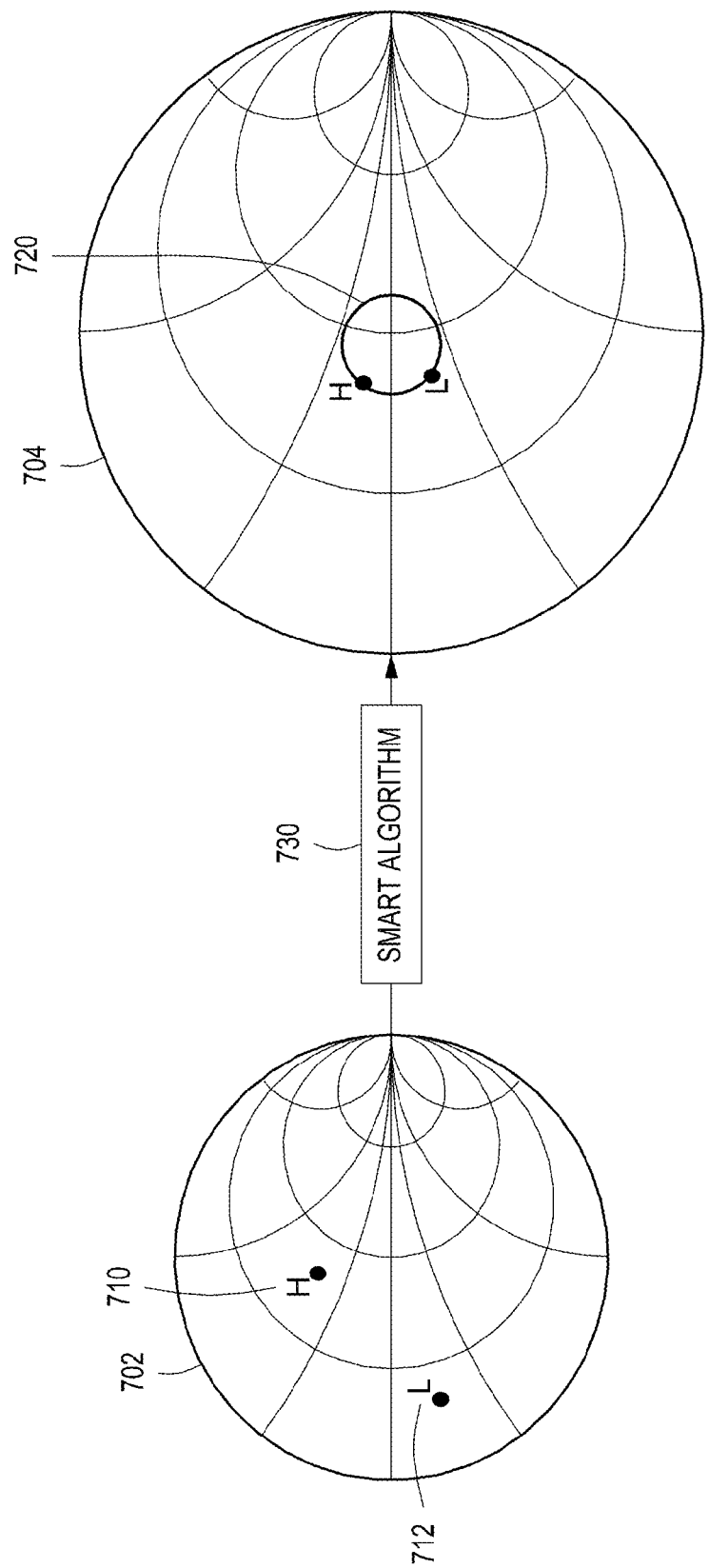
FIG. 7 depicts various Smith charts which show what happens when either a high level impedance or a low level impedance is tuned using a smart algorithm in accordance with some embodiments of the present disclosure.
Figure 8A:
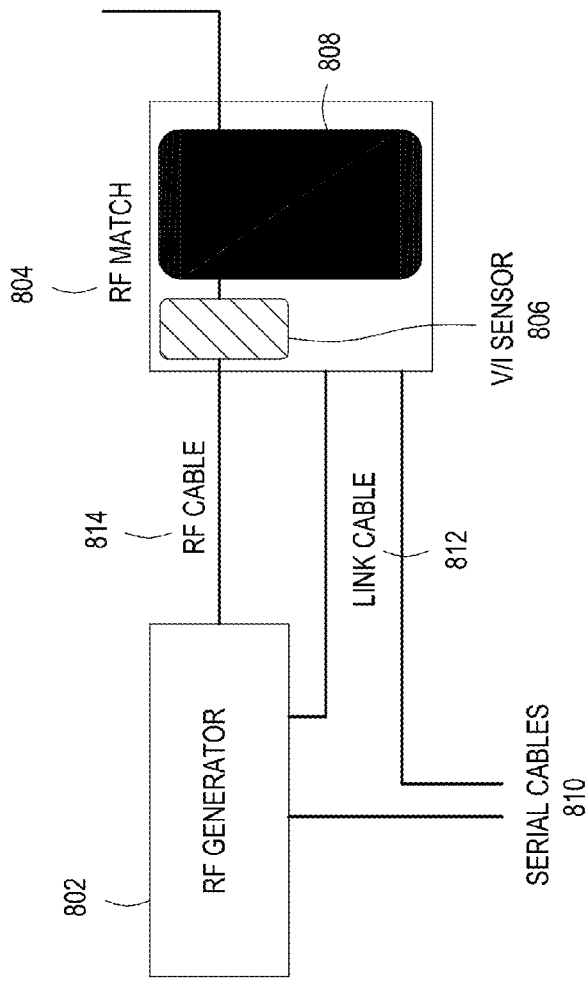
FIG. 8A depicts an exemplary apparatus for employing the smart tuning algorithm in accordance with some embodiments of the present disclosure.
Figure 8B:
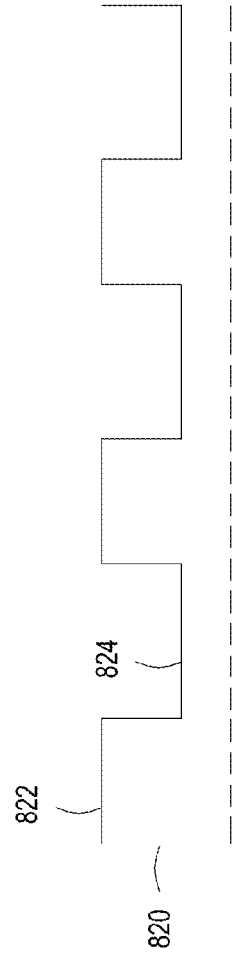
FIG. 8B depicts a dual-level RF pulse forward power that may be delivered by and RF generator to produce the desired delivered power, in accordance with some embodiments of the present disclosure.
Figure 9:
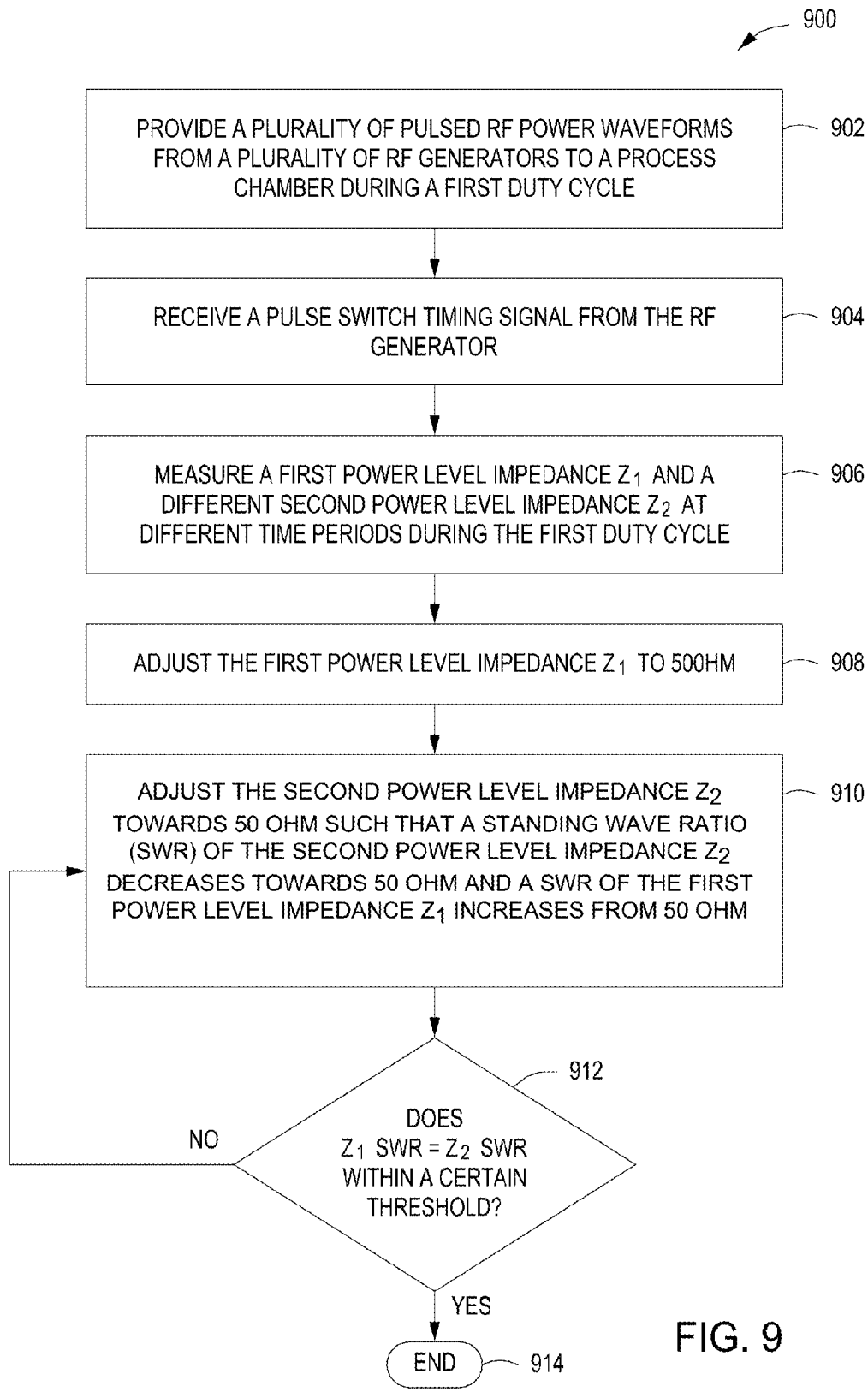
FIG. 9 depicts a flow chart of a method for RF pulse reflection reduction in process chambers that use multiple separate RF power signals pulsed at multiple power levels in accordance with some embodiments of the present disclosure.

In order to minimize the reflected power further, the inventors have developed a method and apparatus which tunes the multiple impedance levels to minimize the average reflected power in DLP mode using a smart algorithm as shown in FIGS. 7-9. In FIG. 7, the high level impedance 710 and the low level impedance 712 shown in chart 702 are tuned using the smart algorithm 730 such that they both fall on the smallest SWR circle 720 on chart 704.

FIG. 8A depicts an exemplary apparatus for employing the smart tuning algorithm in accordance with some embodiments of the present disclosure. As noted above, in some embodiments, the reflected power profiles for each of the plurality of pulsed RF power waveforms are affected by all the pulsed RF power waveforms provided to the process chamber at any given time. In some embodiments, the reflected power may be determined through measurement via one or more RF voltage/current measuring devices (e.g., VI probe/sensor 806) communicatively coupled to the RF generators 802 or by detection of the reflected power by RF generator 802. RF generator 802 is a schematic representation of one or more of generators 140, 144 and 148 of FIG. 1. In FIG. 8A, RF generator may be connected to the RF matching network 804 via RF cables 814 and one or more link cables 812. RF match 804 is a schematic representation of one or more of RF/VHF matches 142, 146, 149. The RF matching network 804 may include one or more RF voltage/current measuring devices (e.g., VI probe/sensor 806) and a match network circuit 808. The match network circuit 808 may include one or more capacitors and/or inductors to provide the desired impedance matching. A plurality of series cables 810 may be used to supply the timing signals (e.g., the 13 MHz on/off timing signal described above) to the RF generator(s) 802 and the RF matching network 804.

FIG. 8B further depicts a dual-level RF pulse forward power 820 that may be delivered by any one of generators 802, 140, 144 or 148 to produce the desired delivered power, in addition to a measured/estimated reflected power. Since the delivered power=forward power−reflected power, the forward power is adjusted to compensate for the reflected power in order to provide the desired delivered power. For example, say the first set point for the delivered power is 500 watts during $t_{HIGH}$. As the one or more of generators 802, 140, 144 or 148 start providing a forward power at a first power level during $t_{HIGH}$, the first power level of the reflected power is measured. In the above example, the one or more of generators 802, 140, 144 or 148 may provide a forward power at 500 watts which produces a reflected power of 20 watts, for example. A load leveling process would compensate for the lost reflected power the first power level by increasing the first power level to provide 520 watts (500 watts+20 watts). The lost reflected power is determined by the calculations shown in 822 (impedance at the high power level is calculated using Zh=Rh+j Xh) and 824 (impedance at the high power level is calculated using Zh=Rh+j Xh).

As discussed above, FIGS. 7, 8A and 8B depicts a tuning method and apparatus for RF pulse reflection reduction in process chambers that use multiple separate RF power signals pulsed at multiple power levels in accordance with some embodiments of the present disclosure. These figures are further discussed with respect to FIG. 9 which depicts a flow chart of a method 900 for RF pulse reflection reduction in process chambers that use multiple separate RF power in accordance with some embodiments of the present disclosure.

The method 900 may be performed, for example, in the plasma reactor discussed above in FIG. 1. The method 900 begins at 902 by providing a plurality of pulsed RF power waveforms from a plurality of RF generators to a process chamber during a first duty cycle. In some embodiments, two or more pulsed RF power waveforms are provided to the process chamber by one or more RF generators. In some embodiments, a first pulsed RF power waveform of the plurality of waveforms is an RF source signal, such as, for example, a forward power provided by the generator 802. The first pulsed RF power waveform may be provided at a VHF frequency of between about 60 MHz to about 162 MHz. In some embodiments, the VHF frequency of the first pulsed RF power waveform is about 162 MHz. In some embodiments, the VHF frequency of the first pulsed RF power waveform is about 60 MHz. In some embodiments, the first power level of the first pulsed RF power waveform may be about 200 watts to about 5.0 KW (e.g., 3.6 KW).

At 904, the RF match receives the pulse switch timing signal or pulse setting information from the RF generator 802 or the semiconductor tool on 810. The pulse switch timing may be a 13 MHz on/off timing signal. At 906, a first power level impedance Z1 and a different second power level impedance Z2 at different time periods during the first duty cycle is measured. For example, the VI probe/sensor 806 on RF match 804 may detect the high power level impedance Zh and the low power level impedance Zl. At 908, the RF match 804 adjusts the first power level impedance Z1 to 50 ohm (e.g., tunes Zh to 50 ohm).

At 910, the second power level impedance Z2 is adjusted/tuned towards 50 ohm which causes the first power level impedance Z1 to be further adjusted such that a standing wave ratio (SWR) of the first power level impedance Z1 increases from 50 ohm, and the second power level impedance Z2 is adjusted such that a SWR of the second power level impedance Z2 decreases. For example, the RF match 804 fine-tunes the impedances of Zh and Zl such that the SWR of Zh increases from 50 ohm and the SWR of Zl decreases.

At 912, it is determined whether Z1 SWR is substantially equal to Z2 SWR which causes the tuning to stop at 914. As used herein, the use of the term "substantially" is intended to cover situations where the measured impedances may not be exactly equal be, but within a certain threshold range. In some embodiments, the threshold may a specified or predetermined percentage of the radius of the SWR for Zh and Zl. The threshold would control the SWR error between Zh and Zl. That is, if the distance of Zh and Zl from 50 ohm is within the threshold range, then tuning would be stopped. For example, say |Zh|=3.8 and |Zl|=3.6 where |Z| means the distance from 50 ohm. The difference/distance between Zh and Zl is 3.8-3.6=0.2. If the threshold is 0.3, tuning would be stopped. If the threshold is 0.1, the system will keep tuning.

If at 912, $Z_1$ SWR does not equal $Z_2$ SWR within a certain threshold, or the SWR delta for $Z_1$ and $Z_2$ changes above a certain threshold, the RF match restart tuning again and returns to 910.

While the foregoing is directed to embodiments of the present disclosure, other and further embodiments of the disclosure may be devised without departing from the basic scope thereof.

The invention claimed is:
1. A method comprising:
 (a) providing a plurality of pulsed RF power waveforms from a plurality of RF generators to a process chamber during a first duty cycle, and providing a pulse switch timing signal from one of the plurality of RF generators to synchronize the plurality of pulsed RF power waveforms from the plurality of RF generators;
 (b) measuring a first power level impedance $Z_1$ and a different second power level impedance $Z_2$ at different time periods during the first duty cycle;
 (c) adjusting the first power level impedance $Z_1$ to 50 ohm;
 (d) further adjusting the first power level impedance $Z_1$ such that a standing wave ratio (SWR) of the first power level impedance $Z_1$ increases from 50 ohm, and adjusting the second power level impedance $Z_2$ such that a SWR of the second power level impedance $Z_2$ decreases; and
 (e) repeating (d) until the SWR of the first power level impedance $Z_1$ is substantially equal to the SWR of the second power level impedance $Z_2$.

2. The method of claim 1, wherein the pulse switch timing signal is a 13 MHz on/off timing signal.

3. The method of claim 1, wherein at least one of the plurality of pulsed RF power waveforms is a dual level pulsing (DLP) waveform pulsed at multiple power levels.

4. The method of claim 1, wherein the first power level impedance $Z_1$ is higher than the second power level impedance $Z_2$.

5. The method of claim 1, wherein the first power level impedance $Z_1$ and the second power level impedance $Z_2$ are measured using a voltage/current measuring device.

6. The method of claim 1, wherein the first power level impedance $Z_1$ is a combined impendence of all the plurality of pulsed RF power waveforms during a first time period of the duty cycle, and wherein the second power level impedance $Z_2$ is a combined impendence of all the plurality of pulsed RF power waveforms during a second time period of the duty cycle.

7. The method of claim 6, wherein the first power level impedance $Z_1$ and second power level impedance $Z_2$ include the impedance produced by a pulse switch timing signal provided by one of the plurality of RF generators to synchronize the plurality of pulsed RF power waveforms from the plurality of RF generators.

8. The method of claim 6, further comprising:
 measuring a third power level impedance $Z_3$ at a third time period during the first duty cycle;
 adjusting the third power level impedance $Z_3$ such that a SWR of the third power level impedance $Z_3$ decreases; and
 repeat (d) until the SWR of the first power level impedance $Z_1$ is substantially equal to the SWR of the second power level impedance $Z_2$ and the third power level impedance $Z_3$.

9. The method of claim 1, wherein the SWR of the first power level impedance $Z_1$ is determined to be substantially equal to the SWR of the second power level impedance $Z_2$ when the first power level impedance $Z_1$ is within a threshold range of the SWR of the second power level impedance $Z_2$.

10. The method of claim 9, wherein the threshold is a predetermined percentage of a radius of the SWR for $Z_1$ and $Z_2$.

11. The method of claim 1, wherein the first power level impedance $Z_1$ and the second power level impedance $Z_2$ are adjusted using a match network.

12. A non-transitory computer readable medium having instructions stored thereon that, when executed, cause a method of operating a plasma enhanced substrate processing system using multi-level pulsed RF power to be performed, the method comprising:
 (a) providing a plurality of pulsed RF power waveforms from a plurality of RF generators to a process chamber during a first duty cycle, and providing a pulse switch timing signal from one of the plurality of RF generators to synchronize the plurality of pulsed RF power waveforms from the plurality of RF generators;
 (b) measuring a first power level impedance $Z_1$ and a different second power level impedance $Z_2$ at different time periods during the first duty cycle;
 (c) adjusting the first power level impedance $Z_1$ to 50 ohm;
 (d) further adjusting the first power level impedance $Z_1$ such that a standing wave ratio (SWR) of the first power level impedance $Z_1$ increases from 50 ohm, and adjusting the second power level impedance $Z_2$ such that a SWR of the second power level impedance $Z_2$ decreases; and
 (e) repeating (d) until the SWR of the first power level impedance $Z_1$ is substantially equal to the SWR of the second power level impedance $Z_2$.

13. The non-transitory computer readable medium of claim 12, wherein the pulse switch timing signal is a 13 MHz on/off timing signal.

14. The non-transitory computer readable medium of claim 12, wherein at least one of the plurality of pulsed RF power waveforms is a dual level pulsing (DLP) waveform pulsed at multiple power levels.

15. The non-transitory computer readable medium of claim 12, wherein the SWR of the first power level impedance $Z_1$ is determined to be substantially equal to the SWR of the second power level impedance $Z_2$ when the first power level impedance $Z_1$ is within a threshold range of the SWR of the second power level impedance $Z_2$.

16. The non-transitory computer readable medium of claim 15, wherein the threshold is a predetermined percentage of a radius of the SWR for $Z_1$ and $Z_2$.

17. A substrate processing system comprising:
 a plurality of RF generators configured to provide a plurality of pulsed RF power waveforms to a process chamber during a first duty cycle, wherein at least one of the plurality of RF generators is configured to provide a pulse switch timing signal to the other the RF generators to synchronize the plurality of pulsed RF power waveforms from the plurality of RF generators;
 at least one voltage/current measuring device configured to measure reflected power for the plurality of pulsed RF power waveforms; and
 one or more match networks each coupled to one of the plurality of RF generators, wherein each of the one or more match networks is configured to:
 (a) adjust a first power level impedance $Z_1$ to 50 ohm;
 (b) further adjust the first power level impedance $Z_1$ such that a standing wave ratio (SWR) of the first power level impedance $Z_1$ increases from 50 ohm, and adjust a second power level impedance $Z_2$ such that a SWR of the second power level impedance $Z_2$ decreases; and (c) repeat (b) until the SWR of the first power level impedance $Z_1$ is substantially equal to the SWR of the second power level impedance $Z_2$ is configured to:
 (a) adjust a first power level impedance $Z_1$ to 50 ohm;
 (b) further adjust the first power level impedance $Z_1$ such that a standing wave ratio (SWR) of the first power level impedance $Z_1$ increases from 50 ohm, and adjust a the second power level impedance $Z_2$ such that a SWR of the second power level impedance $Z_2$ decreases; and
 (c) repeat (b) until the SWR of the first power level impedance $Z_1$ is substantially equal to the SWR of the second power level impedance $Z_2$.

* * * * *